(12) United States Patent  
Sonoda et al.

(10) Patent No.: US 11,963,384 B2  
(45) Date of Patent: Apr. 16, 2024

(54) DISPLAY DEVICE AND METHOD FOR MANUFACTURING SAME

(71) Applicant: SHARP KABUSHIKI KAISHA, Osaka (JP)

(72) Inventors: Tohru Sonoda, Sakai (JP); Takashi Ochi, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 411 days.

(21) Appl. No.: 17/442,547

(22) PCT Filed: Mar. 26, 2019

(86) PCT No.: PCT/JP2019/012938  
§ 371 (c)(1),  
(2) Date: Sep. 23, 2021

(87) PCT Pub. No.: WO2020/194525  
PCT Pub. Date: Oct. 1, 2020

(65) Prior Publication Data  
US 2022/0190288 A1    Jun. 16, 2022

(51) Int. Cl.
| | |
|---|---|
| *H01L 21/00* | (2006.01) |
| *H10K 50/844* | (2023.01) |
| *H10K 59/121* | (2023.01) |
| *H10K 59/65* | (2023.01) |
| *H10K 71/00* | (2023.01) |
| *H10K 77/10* | (2023.01) |
| *H10K 59/12* | (2023.01) |
| *H10K 102/00* | (2023.01) |

(52) U.S. Cl.  
CPC ......... *H10K 50/844* (2023.02); *H10K 59/121* (2023.02); *H10K 59/65* (2023.02); *H10K 71/00* (2023.02); *H10K 77/111* (2023.02); *H10K 59/1201* (2023.02); *H10K 2102/311* (2023.02)

(58) Field of Classification Search  
CPC ..... H10K 59/65; H10K 59/121; H10K 50/844  
See application file for complete search history.

(56) References Cited

U.S. PATENT DOCUMENTS

| | | | |
|---|---|---|---|
| 2019/0051859 A1 | 2/2019 | Choi et al. | |
| 2019/0273167 A1* | 9/2019 | Saitoh | ............... H01L 21/02123 |
| 2020/0185473 A1* | 6/2020 | Son | .................... H01L 27/1225 |

FOREIGN PATENT DOCUMENTS

JP    2019035950 A    3/2019

* cited by examiner

*Primary Examiner* — Douglas M Menz  
(74) *Attorney, Agent, or Firm* — ScienBiziP, P.C.

(57) ABSTRACT

According to an aspect of the disclosure, in a non-display region inside a display region, an oxide semiconductor layer is provided in an island shape, a first opening is provided in a first inorganic insulating film so as to expose the oxide semiconductor layer in the non-display region, a common functional layer is provided so as to extend from the display region to the non-display region, and a second opening is provided so as to expose the oxide semiconductor layer in the common functional layer, a peripheral end of the second opening being surrounded by a peripheral end of the first opening in a plan view.

20 Claims, 12 Drawing Sheets

DISPLAY DEVICE AND METHOD FOR MANUFACTURING SAME

TECHNICAL FIELD

The disclosure relates to a display device and a method for manufacturing the same.

BACKGROUND ART

In recent years, a self-luminous type organic electroluminescence (hereinafter also referred to as EL) display device using an organic EL element has attracted attention as a display device that can replace liquid crystal display devices. For this organic EL display device, there has been proposed a structure in which in order to install an electronic component such as a camera or a fingerprint sensor, for example, a non-display region having an island shape is provided inside a display region in which an image is displayed and a through hole penetrating in the thickness direction is provided in the non-display region.

For example, PTL 1 discloses an electronic device including a display panel in which a module hole penetrating through a front face and a back face of a base substrate is provided in a display region, and an electronic module housed in the module hole.

CITATION LIST

Patent Literature

PTL 1: JP 2019-35950 A

SUMMARY

Technical Problem

The organic EL element includes, for example, a first electrode, an organic EL layer, and a second electrode, which are layered in this order over a substrate. Here, a common functional layer that constitutes the organic EL layer and the second electrode are formed by a vapor deposition using a vapor deposition mask so as to be common to a plurality of subpixels constituting the display region. Thus, when a non-display region having an island shape is disposed inside the display region, it is technically difficult to shield the non-display region with the vapor deposition mask, and thus the common functional layer and the second electrode are also formed in the non-display region. Then, for example, an optical transmittance of the common functional layer reduces performance of the electronic component, and thus the common functional layer formed in the non-display region needs to be removed. Here, in order to remove the common functional layer formed in the non-display region, for example, it is conceived that a metal layer capable of converting light to heat is provided in the non-display region and the metal layer is irradiated with laser light to sublimate the common functional layer. However, when the metal layer is removed in the subsequent step, sealing performance of the organic EL element due to the sealing film may be lowered.

The disclosure has been made in view of the above point, and an object of the disclosure is to remove a common functional layer in a non-display region while securing sealing performance due to a sealing film.

Solution to Problem

To achieve the object described above, a display device according to the disclosure includes: a resin substrate; a thin film transistor layer provided on the resin substrate and including a first inorganic insulating film; a light-emitting element layer provided on the thin film transistor layer and including a plurality of light-emitting elements arranged corresponding to a plurality of subpixels constituting a display region; and a sealing film provided on the light-emitting element layer to cover the light-emitting elements and including a second inorganic insulating film, a frame region being provided around the display region, a non-display region being provided in an island shape within the display region, a first electrode, a first electrode, a functional layer, and a second electrode being sequentially layered on each of the light-emitting elements, and the functional layer including a common functional layer provided in common to the plurality of subpixels, wherein an oxide semiconductor layer is provided in an island shape in the non-display region, a first opening is provided in the first inorganic insulating film to expose the oxide semiconductor layer in the non-display region, the common functional layer is provided to extend from the display region to the non-display region, and a second opening is provided to expose the oxide semiconductor layer in the common functional layer, a peripheral end of the second opening being surrounded by a peripheral end of the first opening in a plan view.

A method for manufacturing a display device according to the disclosure includes: a thin film transistor layer forming step of forming a thin film transistor layer including a first inorganic insulating film on a resin substrate; a light-emitting element layer forming step of forming a light-emitting element layer on the thin film transistor layer, the light-emitting element layer including a plurality of light-emitting elements arranged corresponding to a plurality of subpixels constituting a display region; and a sealing film forming step of forming a sealing film including a second inorganic insulating film on the light-emitting element layer to cover the light-emitting elements, a frame region being provided around the display region, a non-display region being provided in an island shape inside the display region, a first electrode, a functional layer, and a second electrode being sequentially layered on each of the light-emitting elements, and the functional layer including a common functional layer provided in common to the plurality of subpixels, wherein the thin film transistor layer forming step includes a semiconductor layer forming step of forming an oxide semiconductor layer in an island shape in the non-display region, and a first opening forming step of forming a first opening to expose the oxide semiconductor layer to the first inorganic insulating film in the non-display region, the light-emitting element layer forming step includes a functional layer forming step of forming the common functional layer to cover the oxide semiconductor layer exposed from the first opening and extend from the display region to the non-display region, and a functional layer removal step of removing the common functional layer of a portion covering the oxide semiconductor layer by irradiating the oxide semiconductor layer with laser light, and forming a second opening in the common functional layer to expose the oxide semiconductor layer, a peripheral end of the second opening being surrounded by a peripheral end of the first opening in a plan view, and in the sealing film forming step, the second inorganic insulating film is formed to cover the oxide semiconductor layer exposed from the second opening.

Advantageous Effects of Disclosure

According to the disclosure, in the non-display region having an island shape inside the display region, the oxide semiconductor layer is provided in an island shape, and the first inorganic insulating film of the thin film transistor layer is provided with the first opening in the non-display region so as to expose the oxide semiconductor layer, so that it is possible to remove the common functional layer in the non-display region while securing sealing performance due to the sealing film.

DESCRIPTION OF EMBODIMENTS

Embodiments of the disclosure will be described below in detail with reference to the drawings. Note that the disclosure is not limited to each embodiment to be described below.

First Embodiment

Figure 1:
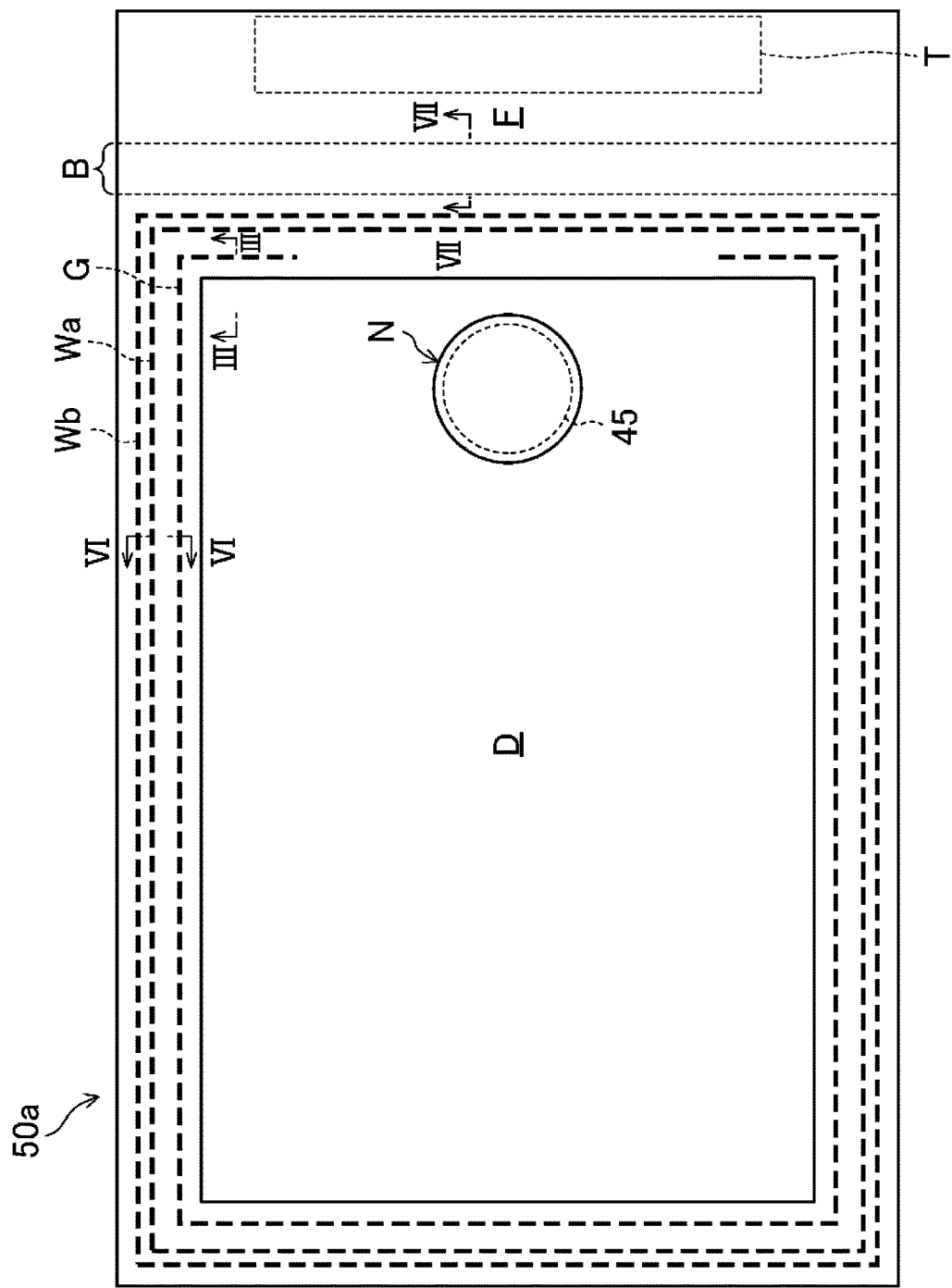
FIG. 1 is a plan view illustrating a schematic configuration of an organic EL display device according to a first embodiment of the disclosure.
Figure 2:
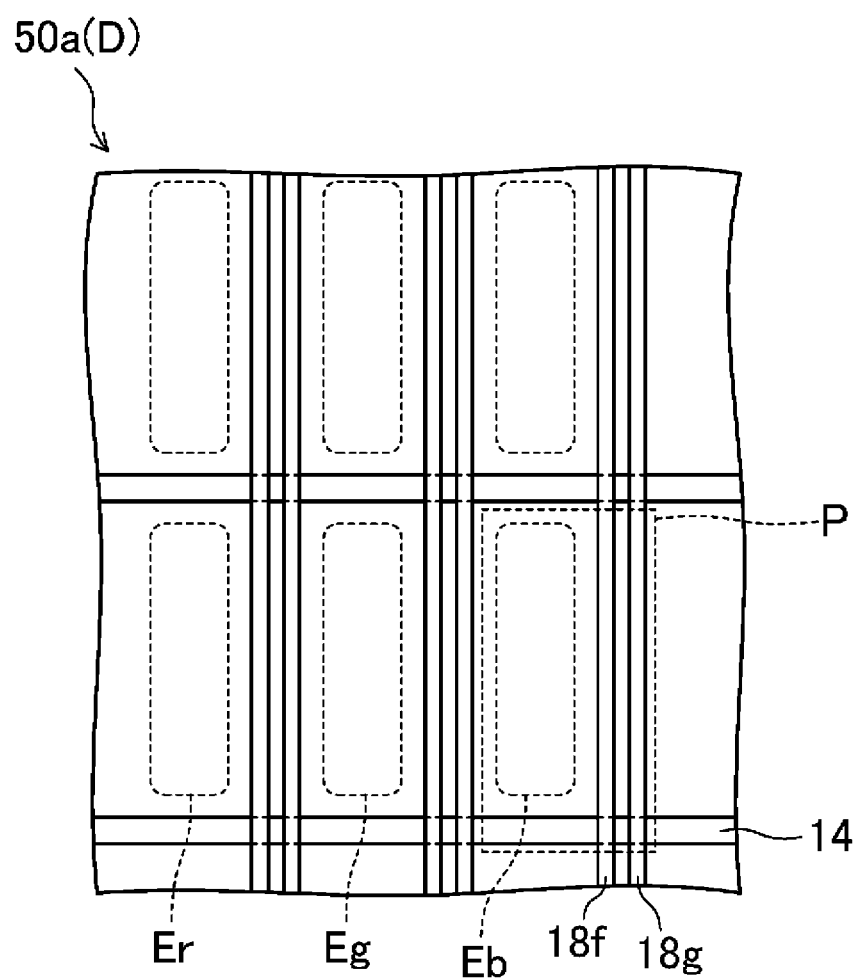
FIG. 2 is a plan view of a display region of the organic EL display device according to the first embodiment of the disclosure.
Figure 3:
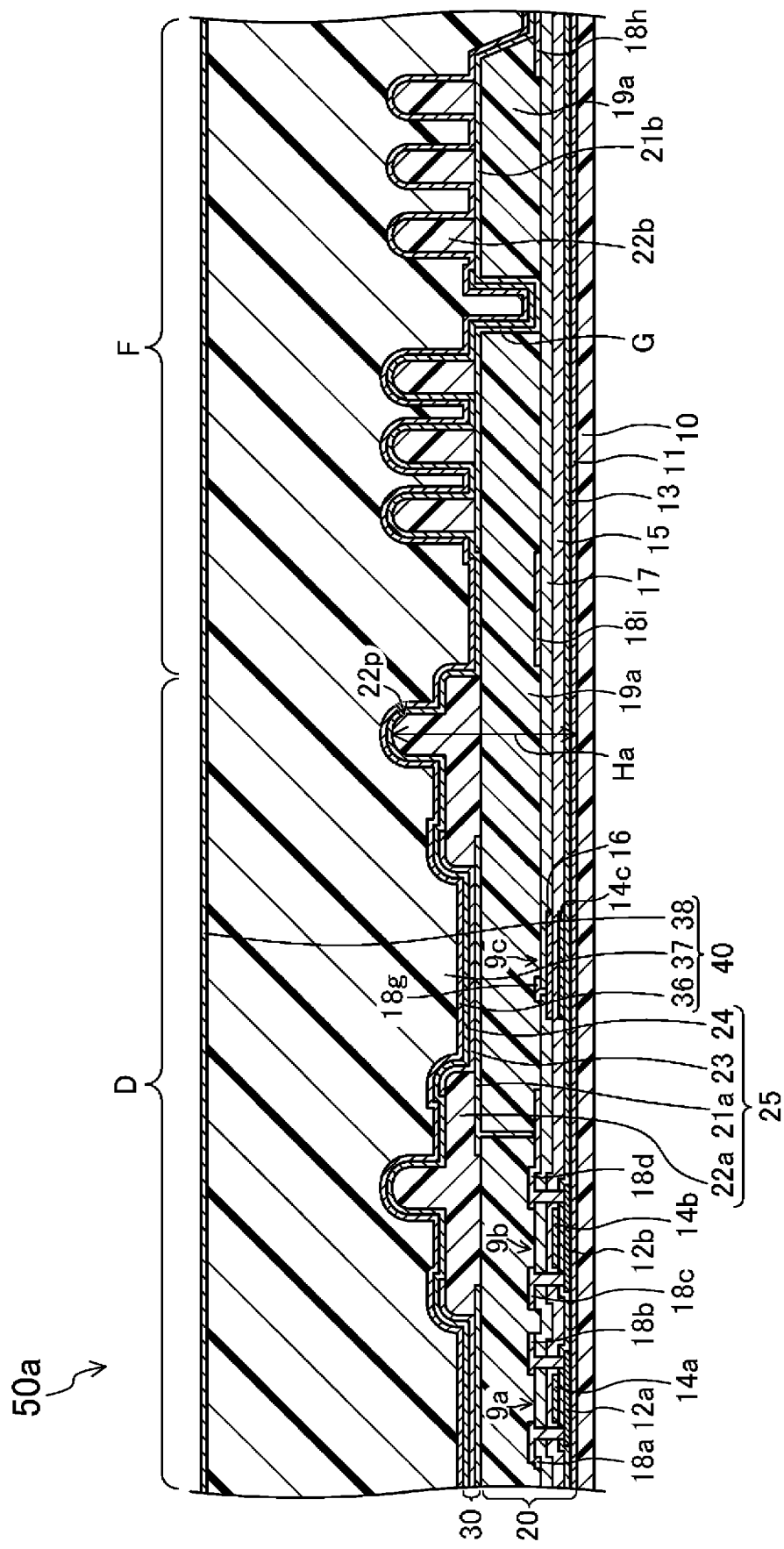
FIG. 3 is a cross-sectional view of the organic EL display device taken along a line III-III in FIG. 1.
Figure 4:
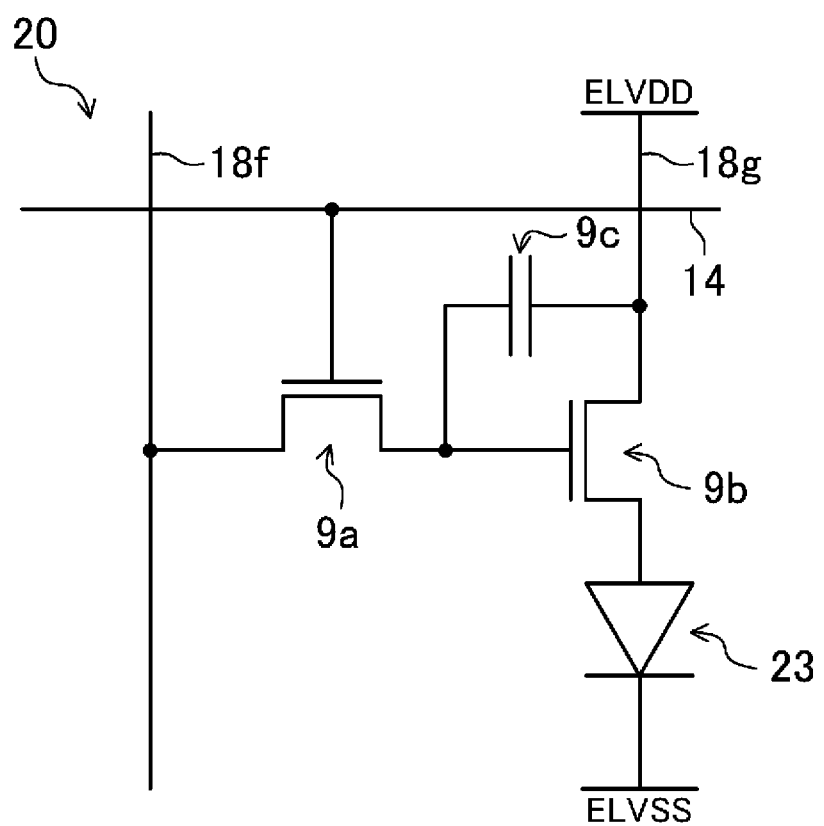
FIG. 4 is an equivalent circuit diagram of a thin film transistor layer constituting the organic EL display device according to the first embodiment of the disclosure.
Figure 5:
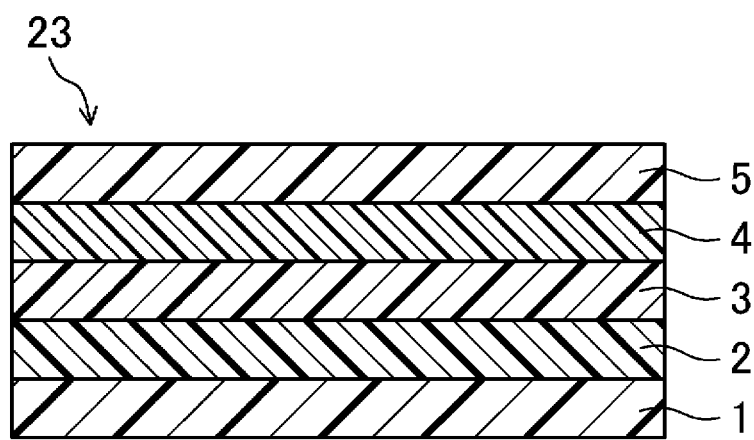
FIG. 5 is a cross-sectional view of an organic EL layer constituting the organic EL display device according to the first embodiment of the disclosure.
Figure 6:
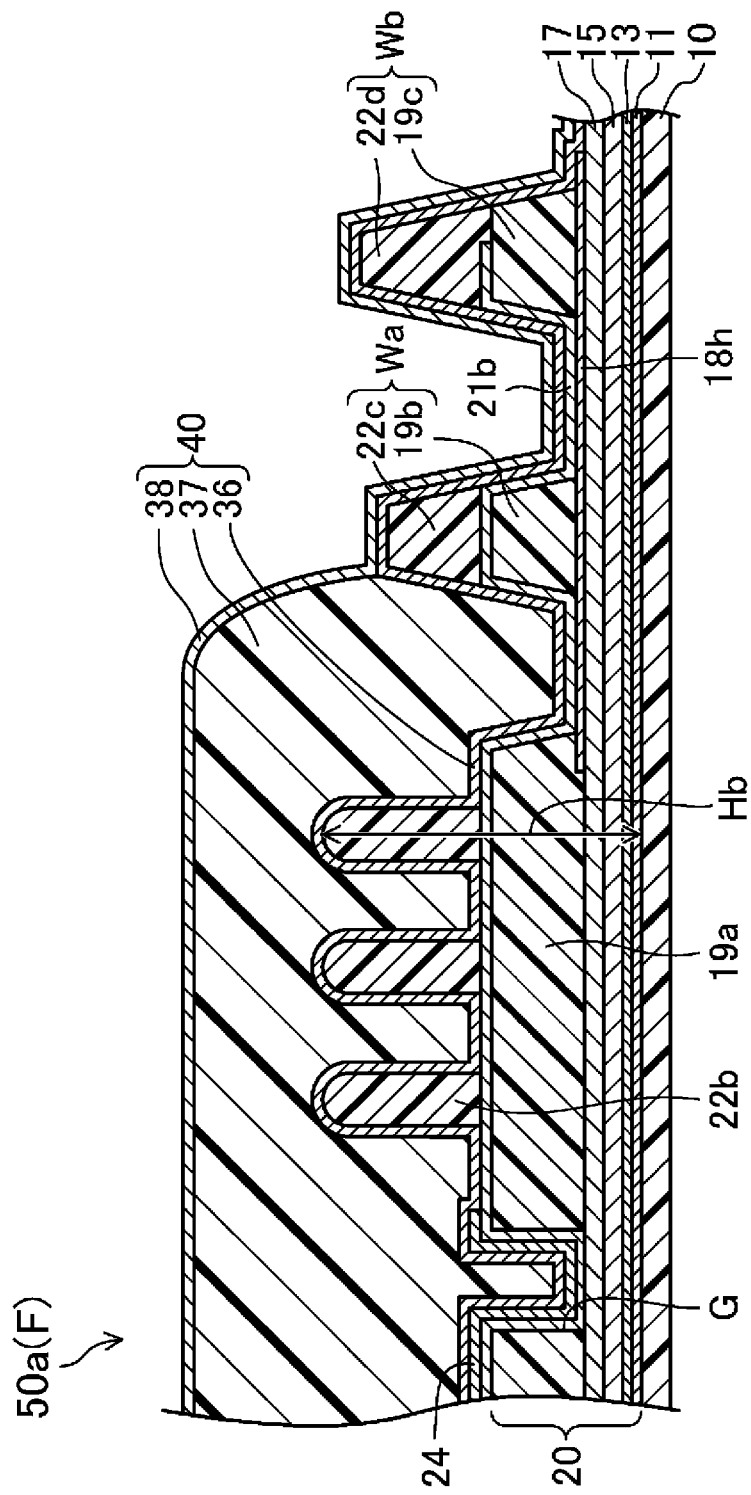
FIG. 6 is a cross-sectional view of a frame region of the organic EL display device taken along a line VI-VI in FIG. 1.
Figure 7:
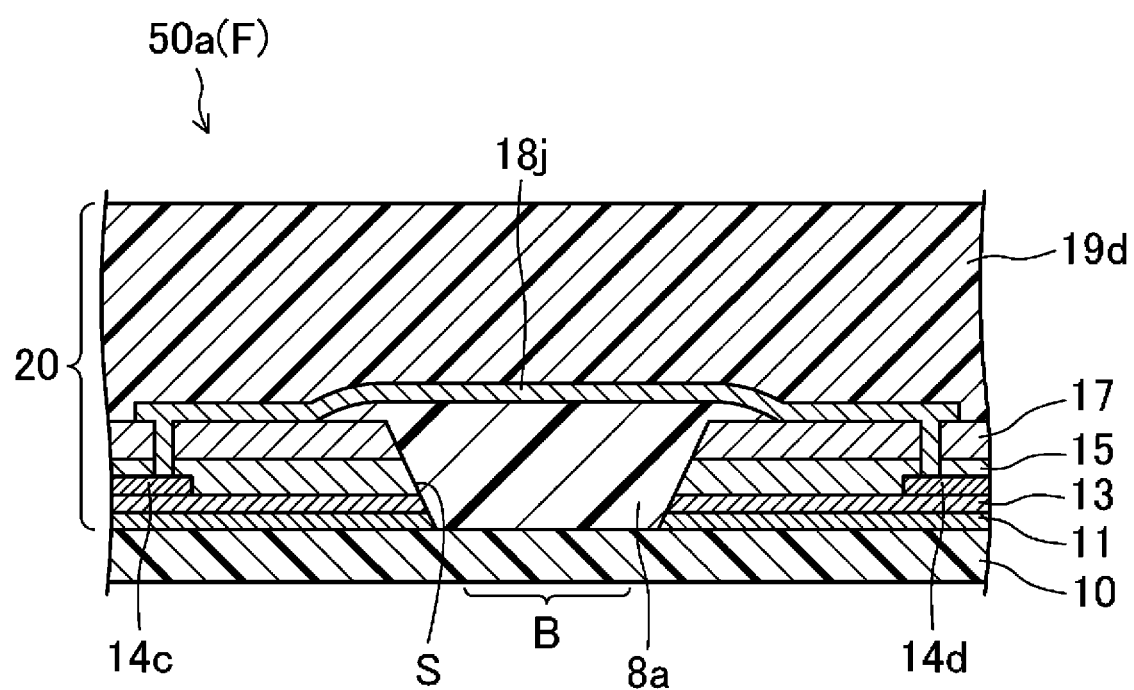
FIG. 7 is a cross-sectional view of a frame region of the organic EL display device taken along a line VII-VII in FIG. 1.
Figure 8:
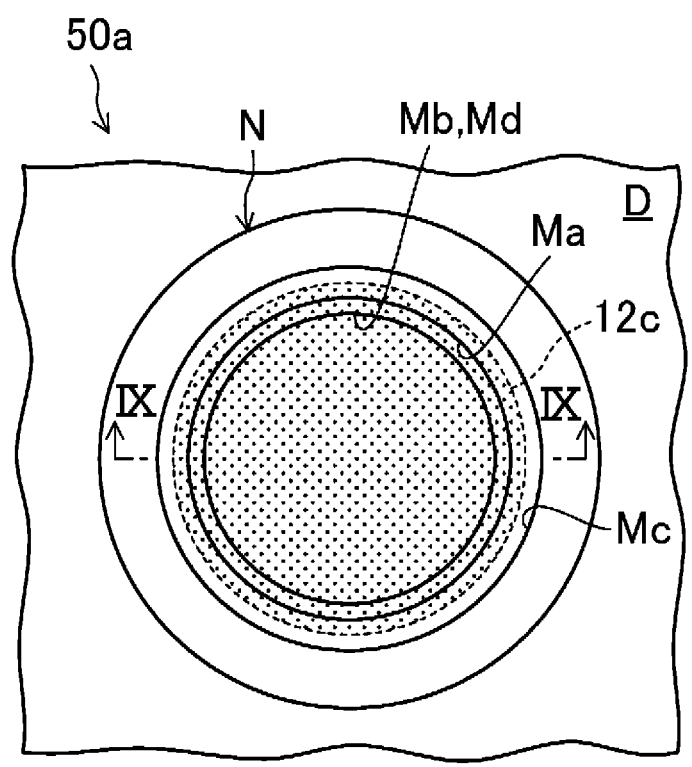
FIG. 8 is a plan view of a non-display region and a periphery of the non-display region of the organic EL display device according to the first embodiment of the disclosure.
Figure 9:
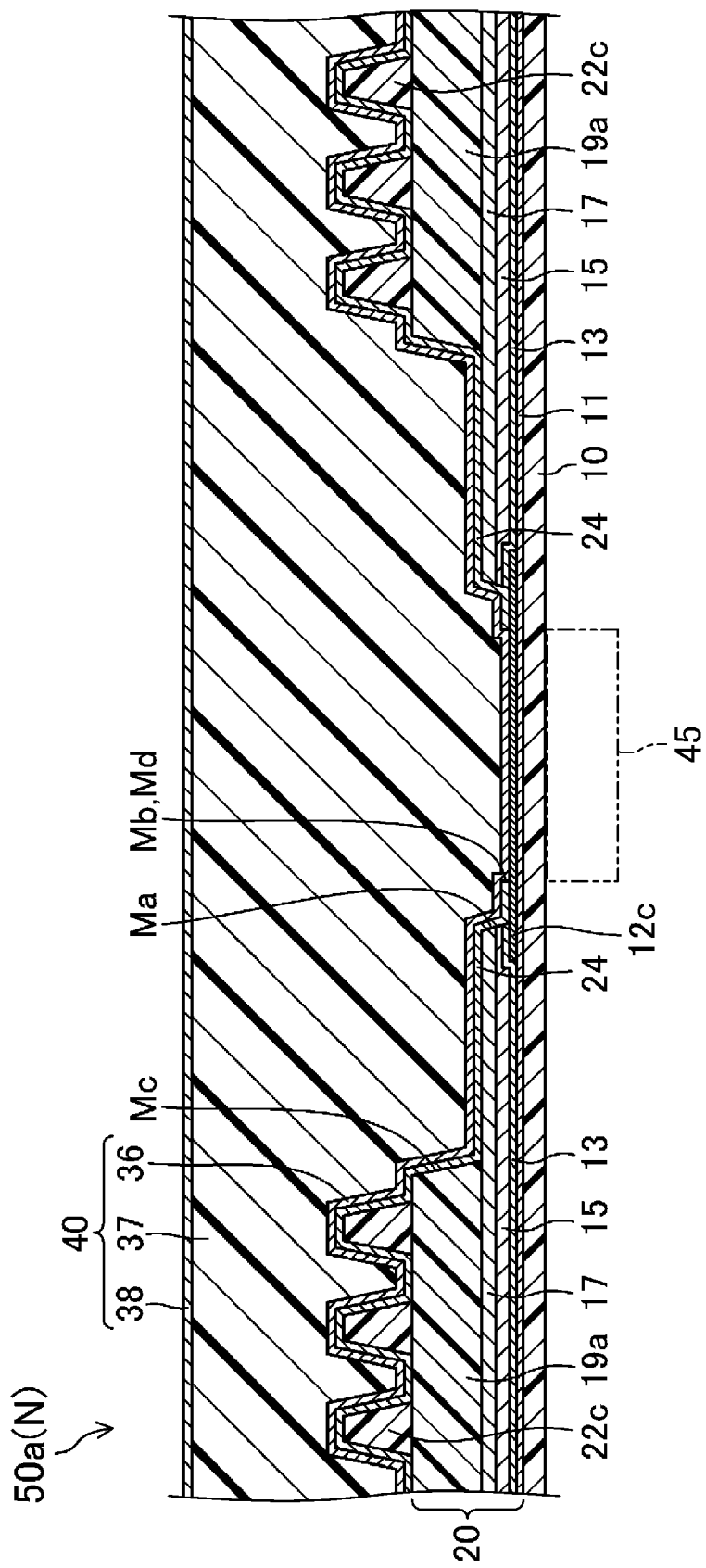
FIG. 9 is a cross-sectional view of the non-display region of the organic EL display device taken along a line IX-IX in FIG. 8.

FIG. 1 to FIG. 10 illustrate a first embodiment of a display device and a method for manufacturing the same according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. Further, FIG. 2 is a plan view of a display region D of the organic EL display device 50a. FIG. 3 is a cross-sectional view of the organic EL display device 50a taken along a line III-III in FIG. 1. FIG. 4 is an equivalent circuit diagram of a thin film transistor layer 20 constituting the organic EL display device 50a. Further, FIG. 5 is a cross-sectional view of an organic EL layer 23 constituting the organic EL display device 50a. FIG. 6 and FIG. 7 are cross-sectional views of a frame region F of the organic EL display device 50a taken along a line VI-VI and line VII-VII, respectively, in FIG. 1. Further, FIG. 8 is a plan view of a non-display region N and a periphery of the non-display region N of the organic EL display device 50a. Further, FIG. 9 is a cross-sectional view of the non-display region N of the organic EL display device 50a taken along a line IX-IX in FIG. 8.

As illustrated in FIG. 1, the organic EL display device 50a includes, for example, the display region D provided in a rectangular shape and configured to display an image, and the frame region F provided in a frame-like shape surrounding the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D. Further, as illustrated in FIG. 1, the non-display region N is provided in an island shape in the display region D. Note that a detailed structure and the like of the non-display region N will be described below with reference to FIG. 8 and FIG. 9.

A terminal portion T is provided in an end portion of the frame region F on the right side in FIG. 1 in such a manner as to extend in one direction (a vertical direction in the drawing). Additionally, as illustrated in FIG. 1, in the frame region F, a bending portion B bendable, for example, by 180 degrees (in a U-shape) about a bending axis that is the vertical direction in the drawing is provided on the display region D side of the terminal portion T in such a manner as to extend in one direction (the vertical direction in the drawing). Here, as illustrated in FIG. 1, FIG. 3, and FIG. 6, in the frame region F, a trench G having a substantially C shape is provided in a flattening film 19a, which will be described below, in such a manner as to penetrate the flattening film 19a. Note that as illustrated in FIG. 1, the trench G is provided in a substantially C shape in such a manner as to open on the terminal portion T side in a plan view.

As illustrated in FIG. 3, FIG. 6, FIG. 7, and FIG. 9, the organic EL display device 50a includes a resin substrate layer 10 provided as a resin substrate, a thin film transistor (hereinafter also referred to as TFT) layer 20 provided on the resin substrate layer 10, an organic EL element layer 30 provided on the TFT layer 20, and a sealing film 40 provided on the organic EL element layer 30.

The resin substrate layer 10 is formed, for example, of a polyimide resin or the like.

As illustrated in FIG. 3, FIG. 6, FIG. 7, and FIG. 9, the TFT layer 20 includes a gate insulating film 13, a first interlayer insulating film 15, and a second interlayer insulating film 17 sequentially provided as first inorganic insulating films on the resin substrate layer 10, and the flattening film 19a provided on the second interlayer insulating film 17. Specifically, as illustrated in FIG. 3, the TFT layer 20 includes a base coat film 11 provided on the resin substrate layer 10 side, a plurality of first TFTs 9a, a plurality of second TFTs 9b, and a plurality of capacitors 9c provided on the base coat film 11, and the flattening film 19a provided on the first TFTs 9a, the second TFTs 9b, and the capacitors 9c. Here, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in the vertical direction in the drawings. Further, in the TFT layer 20, as illustrated in FIG. 2 and FIG. 4, a plurality of power source lines 18g are provided so as to extend parallel to each other in the vertical direction in the drawings. Then, as illustrated in FIG. 2, each of the power source lines 18g is provided to be adjacent to each of the source lines 18f. Further, in the TFT layer 20, as illustrated in FIG. 4, each of the subpixels P includes the first TFT 9a, the second TFT 9b, and the capacitor 9c.

The base coat film 11, the gate insulating film 13, the first interlayer insulating film 15, and the second interlayer insulating film 17 are each constituted of a single-layer film or a layered film of an inorganic insulating film of, for example, silicon nitride, silicon oxide, or silicon oxynitride.

The first TFT 9a is electrically connected to the corresponding gate line 14 and source line 18f in each of the subpixels P, as illustrated in FIG. 4. Additionally, as illustrated in FIG. 3, the first TFT 9a includes a semiconductor layer 12a, a gate insulating film 13, a gate electrode 14a, the first interlayer insulating film 15, the second interlayer insulating film 17, and a source electrode 18a and a drain electrode 18b, which are sequentially provided on the base coat film 11. Here, the semiconductor layer 12a includes, for example, an In—Ga—Zn—O-based semiconductor such as InGaZnO$_4$, is provided in an island shape on the base coat film 11 as illustrated in FIG. 3, and includes a channel region, a source region, and a drain region. Additionally, as illustrated in FIG. 3, the gate insulating film 13 is provided so as to cover the semiconductor layer 12a. Additionally, as illustrated in FIG. 3, the gate electrode 14a is provided on the gate insulating film 13, and overlaps with the channel region of the semiconductor layer 12a. Additionally, as illustrated in FIG. 3, the first interlayer insulating film 15 and the second interlayer insulating film 17 are sequentially provided so as to cover the gate electrode 14a. Additionally, as illustrated in FIG. 3, the source electrode 18a and the drain electrode 18b are provided being separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that, in the present embodiment, as a transparent amorphous oxide semiconductor (TaOS) constituting the semiconductor layer 12a, an In—Ga—Zn—O-based semiconductor has been exemplified, but another semiconductor such as In—Sn—Zn—O-based, In—Al—Zn—O-based, In—Al—Sn—Zn—O-based, Zn—O-based, In—Zn—O-based, Zn—Ti—O-based, Cd—Ge—O-based, Cd—Pb—O-based, Cd—Zn—O-based, Cd—O-based, Mg—Zn—O, In—Ga—Sn—O-based, In—Ga—O-based, Zr—In—Zn—O-based, Hf—In—Zn—O-based, Al—Ga—Zn—O-based, Ga—Zn—O-based, or In—Ga—Zn—O-based semiconductor may be included. Specific examples of the In—Sn—Zn—O-based semiconductor include In$_2$O$_3$—SnO$_2$—ZnO and the like. In addition, examples of the In—Ga—Zn—O-based semiconductor include InGaO$_3$(ZnO)$_5$ and the like. As the Zn—O-based semiconductor, a semiconductor of ZnO in an amorphous state, a polycrystalline state, or a microcrystalline state in which the amorphous state and the polycrystalline state are mixed, the ZnO to which an impurity element of at least one kind selected from Group 1 elements, Group 13 elements, Group 14 elements, Group 15 elements, Group 17 elements, and the like is added or no impurity is added, can be used.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are sequentially provided on the base coat film 11. Here, the semiconductor layer 12b includes, for example, an In—Ga—Zn—O-based semiconductor such as InGaZnO$_4$, as illustrated in FIG. 3, is provided in an island shape on the base coat film 11, and includes a channel region, a source region, and a drain region. Additionally, as illustrated in FIG. 3, the gate insulating film 13 is provided so as to cover the semiconductor layer 12b. Additionally, as illustrated in FIG. 3, the gate electrode 14b is provided on the gate insulating film 13, and overlaps with the channel region of the semiconductor layer 12b. Additionally, as illustrated in FIG. 3, the first interlayer insulating film 15 and the second interlayer insulating film 17 are sequentially provided so as to cover the gate electrode 14b. Additionally, as illustrated in FIG. 3, the source electrode 18c and the drain electrode 18d are provided being separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as those of the gate electrodes 14a and 14b, the first interlayer insulating film 15 provided so as to cover the lower conductive layer 14c, and an upper conductive layer 16 provided on the first interlayer insulating film 15 so as to overlap with the lower conductive layer 14c. Note that, as illustrated in FIG. 3, the upper conductive layer 16 is electrically connected to the power source line 18g via a contact hole formed in the second interlayer insulating film 17.

The flattening film 19a is formed of, for example, a positive-working photosensitive resin such as a polyimide resin.

As illustrated in FIG. 3, the organic EL element layer 30 includes a plurality of organic EL elements 25 arranged in a matrix shape on the flattening film 19a. Here, the plurality of organic EL elements 25 are provided as a plurality of light-emitting elements arranged corresponding to the plurality of subpixels P.

As illustrated in FIG. 3, the organic EL element 25 includes a first electrode 21a, an organic EL layer 23, and a second electrode 24 sequentially layered on the TFT layer 20. Specifically, as illustrated in FIG. 3, the organic EL element 25 includes the first electrode 21a provided on the flattening film 19a of the TFT layer 20, the organic EL layer 23 provided on the first electrode 21a as a functional layer, and the second electrode 24 provided on the organic EL layer 23 to be common to the plurality of subpixels P.

As illustrated in FIG. 3, the first electrode 21a is electrically connected to the drain electrode 18d of the second TFT 9b of each of the subpixels P via a contact hole formed in the flattening film 19a. The first electrode 21a functions to inject holes (positive holes) into the organic EL layer 23. The first electrode 21a is preferably formed of a material having a large work function to improve the hole injection efficiency into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a may include an alloy with astatine (At)/astatine oxide ($AtO_2$). Examples of materials constituting the first electrode 21a may include electrically conductive oxides such as tin oxide (SnO), zinc oxide (ZnO), indium tin oxide (ITO), and indium zinc oxide (IZO). The first electrode 21a may be formed by layering a plurality of layers formed of any of the materials described above. Note that, examples of compound materials having a large work function include indium tin oxide (ITO) and indium zinc oxide (IZO). Furthermore, a peripheral end portion of the first electrode 21a is covered by an edge cover 22a provided in a lattice pattern common to the plurality of subpixels P. Examples of materials constituting the edge cover 22a include a positive-working photosensitive resin such as polyimide resin, acrylic resin, polysiloxane resin, and novolak resin. Further, as illustrated in FIG. 3, a part of a surface of the edge cover 22a projects upward in the drawing and becomes pixel photospacers 22p each provided in an island shape as first photospacers.

The organic EL layer 23 includes a hole injection layer 1, a hole transport layer 2, a light-emitting layer 3, an electron transport layer 4, and an electron injection layer 5, which are sequentially provided on the first electrode 21a, as illustrated in FIG. 5.

The hole injection layer 1 is also referred to as an anode buffer layer, functions to reduce an energy level difference between the first electrode 21a and the organic EL layer 23 to thereby improve the hole injection efficiency from the first electrode 21a to the organic EL layer 23, and is provided as a common functional layer of an organic vapor deposition layer common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives and the like. Note that the common functional layer is a functional layer formed using a common metal mask (CMM). This CMM is a mask in which one opening is provided corresponding to one display device, and thus cannot include a pattern that shields the non-display region N having an island shape. Accordingly, the common functional layer is also deposited on the non-display region N. In contrast, an individual functional layer is a functional layer formed using a fine metal mask (FMM). This FMM is a mask in which an opening is provided for each color (e.g., including a functional layer common in red and green). Furthermore, in addition to the hole injection layer 1 described above, the functional layer includes the hole transport layer 2, the light-emitting layer 3, the electron transport layer 4, the electron injection layer 5, and the like.

The hole transport layer 2 functions to improve the transport efficiency of holes from the first electrode 21a to the organic EL layer 23, and is provided as a common functional layer of an organic vapor deposition layer common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide and the like.

The light-emitting layer 3 is provided as an individual functional layer which is a region where holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having high light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like.

The electron transport layer 4 functions to facilitate migration of electrons to the light-emitting layer 3 efficiently, and is provided as a common functional layer of an inorganic vapor deposition layer common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds and the like, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer, and is provided as a common functional layer of an inorganic vapor deposition layer common to the plurality of subpixels P. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO) and the like.

Note that the common functional layers described above are exemplary, and any of the layers may be an individual functional layer. For example, in a case where the display device is configured by performing color conversion using a quantum-dot light emitting diode (QLED) or the like from a light-emitting layer emitting ultraviolet light or blue light, the light-emitting layer 3 may be provided as a common functional layer.

As illustrated in FIG. 3, the second electrode 24 is provided so as to cover the organic EL layers 23 and the edge cover 22a to be common to the plurality of subpixels P. In addition, the second electrode 24 functions to inject electrons into the organic EL layer 23. In addition, the second electrode 24 is preferably formed of a material having a low work function to improve the efficiency of electron injection into the organic EL layer 23. Here, examples of materials that may be included in the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al) and the like.

As illustrated in FIG. 3, FIG. 6, and FIG. 9, the sealing film 40 is provided so as to cover the organic EL elements 25, and functions to protect the organic EL layer 23 of each of the organic EL elements 25 from moisture, oxygen, and the like. Specifically, as illustrated in FIG. 3, FIG. 6, and FIG. 9, the sealing film 40 includes a lower second inorganic insulating film 36 provided on the resin substrate layer 10 side so as to cover the second electrode 24, an upper second inorganic insulating film 38 provided on the side opposite to the resin substrate layer 10, and an organic insulating film 37 provided between the lower second inorganic insulating film 36 and the upper second inorganic insulating film 38. Here, the lower second inorganic insulating film 36 and the upper second inorganic insulating film 38 are each formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$), or silicon carbonitride (SiCN). On the other hand, the organic insulating film 37 is formed of, for example, an organic material such as acrylic resin, polyurea resin, parylene resin, polyimide resin, or polyamide resin.

Additionally, as illustrated in FIG. 1, the organic EL display device 50a includes, in the frame region F, a first dam wall Wa provided in a frame-like shape so as to surround the display region D and overlap with a peripheral end portion of the organic insulating film 37, and a second dam wall Wb provided in a frame-like shape so as to surround the first dam wall Wa.

As illustrated in FIG. 6, the first dam wall Wa includes a first resin layer 19b formed of the same material as and in the same layer as those of the flattening film 19a, and a second resin layer 22c that is provided on the first resin layer 19b via the first conductive layer 21b and is formed of the same material as and in the same layer as those of the edge cover 22a. Here, as illustrated in FIG. 6, the first conductive layer 21b is provided in a substantially C shape in such a manner as to overlap with the trench G, the first dam wall Wa, and the second dam wall Wb in the frame region F. Note that the first conductive layer 21b is formed of the same material as and in the same layer as those of the first electrode 21a.

As illustrated in FIG. 6, the second dam wall Wb includes a first resin layer 19c formed of the same material as and in the same layer as those of the flattening film 19a, and a second resin layer 22d that is provided on the first resin layer 19c via the first conductive layer 21b and is formed of the same material as and in the same layer as those of the edge cover 22a.

As illustrated in FIG. 3 and FIG. 6, the organic EL display device 50a includes a first frame wiring line 18 h provided outside of the trench G in such a manner as to surround the display region D and overlap with the first dam wall Wa and the second dam wall Wb, in the frame region F. Here, the first frame wiring line 18 h is electrically connected to a power supply terminal to which a low power supply voltage (ELVSS) is input at the terminal portion T. Further, as illustrated in FIG. 6, the first frame wiring line 18 h is electrically connected to the second electrode 24 via the first conductive layer 21b.

In addition, as illustrated in FIG. 3, the organic EL display device 50a includes a second frame wiring line 18i provided inside of the trench G in the frame region F. Here, the second frame wiring line 18i is electrically connected to a power supply terminal to which a high power supply voltage (ELVDD) is input at the terminal portion T. The second frame wiring line 18i is electrically connected, on the display region D side, to the plurality of power source lines 18g disposed in the display region D.

Furthermore, as illustrated in FIG. 7, the organic EL display device 50a includes: a lower layer flattening film 8a provided to be filled in a slit S formed in the base coat film 11, the gate insulating film 13, the first interlayer insulating film 15, and the second interlayer insulating film 17; a plurality of lead wiring lines 18j provided on the lower layer flattening film 8a and the second interlayer insulating film 17; and a wiring line covering layer 19d provided so as to cover the plurality of lead wiring lines 18j, in the bending portion B.

As illustrated in FIG. 7, the slit S is provided to be formed in a groove shape that penetrates the base coat film 11, the gate insulating film 13, the first interlayer insulating film 15, and the second interlayer insulating film 17, and proceeds along a direction in which the bending portion B extends so as to expose the surface of the resin substrate layer 10.

The lower layer flattening film 8a is formed of, for example, an organic resin material such as a polyimide resin.

The plurality of lead wiring lines 18j are provided so as to extend parallel to each other in a direction orthogonal to the direction in which the bending portion B extends. Here, as illustrated in FIG. 7, both end portions of each of the lead wiring lines 18j are electrically connected to a first gate conductive layer 14c and a second gate conductive layer 14d, respectively, via respective contact holes formed in layered films of the first interlayer insulating film 15 and the second interlayer insulating film 17. Note that the lead wiring lines 18j are each formed of the same material as and in the same layer as those of the source line 18f and the power source line 18g. Further, as illustrated in FIG. 7, the first gate conductive layer 14c is provided between the gate insulating film 13 and the first interlayer insulating film 15, and is electrically connected to signal wiring lines (the gate line 14, the source line 18f, and the like) extending in the display region D. Further, as illustrated in FIG. 7, the second gate conductive layer 14d is provided between the gate insulating film 13 and the first interlayer insulating film 15, and is electrically connected to a signal terminal of the terminal portion T. Further, the wiring line covering layer 19d is formed of the same material as and in the same layer as those of the flattening film 19a.

As illustrated in FIG. 3 and FIG. 6, the organic EL display device 50a includes a plurality of frame photospacers 22b each provided in an island shape as second photospacers in such a manner as to project upward in the drawing, on the flattening film 19a in the frame region F. Here, the frame photospacers 22b are each formed of the same material as and in the same layer as those of the edge cover 22a. The frame photospacers 22b each may be formed by layering a resin layer formed of the same material as and in the same layer as those of the edge cover 22a, and another resin layer.

As illustrated in FIG. 9, the organic EL display device 50a includes a plurality of non-display photospacers 22c each provided in an island shape as third photospacers in such a manner as to surround a third opening Mc, which will be describe below, in a plan view and project upward in the drawing, on the flattening film 19a in the non-display region N. Here, the non-display photospacers 22c are each formed of the same material as and in the same layer as those of the edge cover 22a. The non-display photospacers 22c each may be formed by layering a resin layer formed of the same material as and in the same layer as those of the edge cover 22a, and another resin layer.

As illustrated in FIG. 8 and FIG. 9, the organic EL display device 50a includes an oxide semiconductor layer 12c (see the dotted portion in FIG. 8) provided in a circular island shape along the boundary with the display region D, in the non-display region N. Here, the oxide semiconductor layer 12c is provided on the base coat film 11, and is formed of the same material as and in the same layer as those of the semiconductor layers 12a and 12b. Furthermore, as illustrated in FIG. 8 and FIG. 9, in the gate insulating film 13, the first interlayer insulating film 15, and the second interlayer insulating film 17, a first opening Ma is provided in the non-display region N so as to expose the oxide semiconductor layer 12c. Note that, as illustrated in FIG. 8 and FIG. 9, a peripheral end of the first opening Ma is surrounded by a peripheral end of the oxide semiconductor layer 12c in a plan view, and the peripheral end portion of the oxide semiconductor layer 12c is covered by the gate insulating film 13, the first interlayer insulating film 15, and the second interlayer insulating film 17. Furthermore, as illustrated in FIG. 9, the second electrode 24 is provided so as to extend from the display region D to the non-display region N. In addition, as illustrated in FIG. 8 and FIG. 9, a fourth opening Md is provided in the second electrode 24 so as to have a peripheral end surrounded by the peripheral end of the first opening Ma in a plan view and expose the oxide semiconductor layer 12c. Note that, although the hole injection layer 1, the hole transport layer 2, the electron transport layer 4, and the electron injection layer 5 are not illustrated in FIG. 9, the common functional layer including the hole injection layer 1, the hole transport layer 2, the electron transport layer 4, and the electron injection layer 5 is provided so as to extend from the display region D to the non-display region N, similarly to the second electrode 24, and a second opening Mb is provided in the common functional layer so as to have a peripheral end surrounded by the peripheral end of the first opening Ma in a plan view and expose the oxide semiconductor layer 12c. Furthermore, as illustrated in FIG. 8 and FIG. 9, the peripheral ends of the second opening Mb and the fourth opening Md coincide with each other, and the oxide semiconductor layer 12c and the lower second inorganic insulating film 36 of the sealing film 40 are in contact with each other via the second opening Mb and the fourth opening Md, as illustrated in FIG. 9. In addition, as illustrated in FIG. 9, the third opening Mc is provided in the flattening film 19a so as to expose the second interlayer insulating film 17 in the non-display region N. Note that, as illustrated in FIG. 8 and FIG. 9, a peripheral end of the third opening Mc surrounds the peripheral end of the first opening Ma in a plan view. As illustrated in FIG. 9, the sealing film 40 is provided so as to overlap with the oxide semiconductor layer 12c in the non-display region N.

As illustrated in FIG. 1 and FIG. 9, the organic EL display device 50a includes a camera 45 installed as an electronic component on a side opposite to the TFT layer 20 of the resin substrate layer 10 in the non-display region N in such a manner as to face the oxide semiconductor layer 12c. Here, the camera 45 is composed of a charge coupled device (CCD), a complementary metal oxide semiconductor (CMOS) image sensor, or the like, and is mounted inside a housing accommodating the organic EL display device 50a. Note that in the present embodiment, the camera 45 is exemplified as an electronic component, but the electronic component may be a fingerprint sensor or the like.

In the organic EL display device 50a described above, in each subpixel P, a gate signal is input to the first TFT 9a via the gate line 14 to turn on the first TFT 9a, a data signal is written in the gate electrode 14b of the second TFT 9b and the capacitor 9c via the source line 18f, and a current from the power source line 18g corresponding to the gate voltage of the second TFT 9b is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Figure 10:
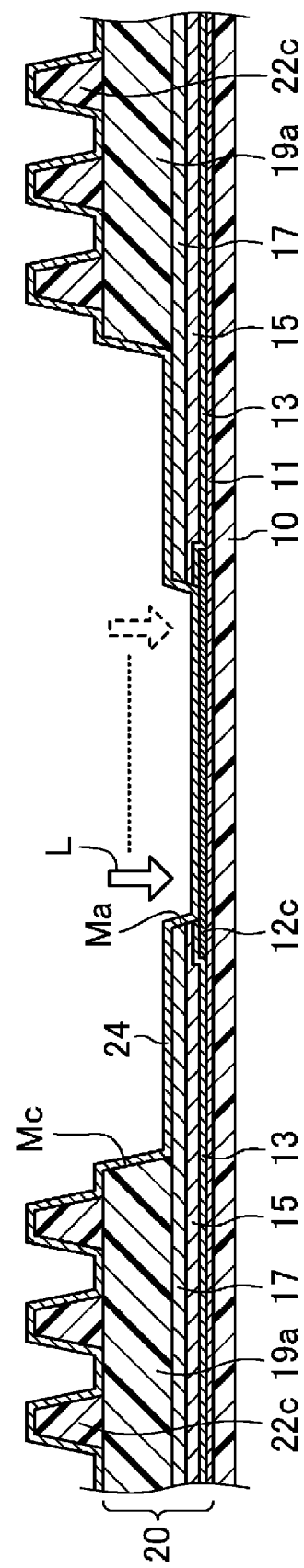
FIG. 10 is a cross-sectional view illustrating a functional layer removal step of an organic EL element layer forming step in a method for manufacturing the organic EL display device according to the first embodiment of the disclosure.

Next, a method for manufacturing the organic EL display device 50a according to the present embodiment will be described. Here, the method for manufacturing the organic EL display device 50a according to the present embodiment includes a TFT layer forming step, an organic EL element layer forming step, a sealing film forming step, a flexing step, and a component mounting step. Note that FIG. 10 is a cross-sectional view illustrating a functional layer removal step of an organic EL element layer forming step in the method for manufacturing the organic EL display device 50a.

TFT Layer Forming Step

For example, by using a known method, the TFT layer 20 is formed by forming the base coat film 11, the first TFT 9a, the second TFT 9b, the capacitor 9c, and the flattening film 19a on a surface of the resin substrate layer 10 formed on a glass substrate.

Here, when the semiconductor layer 12a of the first TFT 9a and the semiconductor layer 12b of the second TFT 9b are formed, the oxide semiconductor layer 12c is formed in an island shape in the non-display region N (semiconductor layer forming step). Furthermore, when a contact hole is formed in the step of forming the first TFT 9a and the second TFT 9b, the first opening Ma is formed in the gate insulating film 13, the first interlayer insulating film 15, and the second interlayer insulating film 17 so as to expose the oxide semiconductor layer 12c, in the non-display region N (first opening forming step).

Organic EL Element Layer Forming Step

First, on the flattening film 19a of the TFT layer 20, which is formed in the TFT layer forming step described above, the first electrode 21a and the edge cover 22a are formed by using a known method.

Subsequently, the hole injection layer 1, the hole transport layer 2, the light-emitting layer 3, the electron transport layer 4, and the electron injection layer 5 are sequentially formed on the first electrode 21a exposed from the edge cover 22a by, for example, a vacuum vapor deposition technique to form the organic EL layer 23 (functional layer forming step). Note that when the hole injection layer 1, the hole transport layer 2, the electron transport layer 4, and the electron injection layer 5 are formed, the CMM is used as the vapor deposition mask, and when the light-emitting layer 3 is formed, the FMM is used as the vapor deposition mask.

Thereafter, the second electrode 24 is formed using the CMM by, for example, the vacuum vapor deposition technique so as to cover the organic EL layer 23 and extend from the display region D to the non-display region N.

In addition, as illustrated in FIG. 10, the oxide semiconductor layer 12c is scanned in a circular shape in a plan view while being irradiated with laser light L having a wavelength of the ultraviolet range (for example, about 300 nm to 400 nm) to remove the hole injection layer 1, the hole transport layer 2, the electron transport layer 4, the electron injection layer 5, and the second electrode 24 in a portion covering the oxide semiconductor layer 12c, whereby the second opening Mb is formed in the hole injection layer 1, the hole transport layer 2, the electron transport layer 4, and the electron injection layer 5 in such a manner that the peripheral end of the second opening Mb is surrounded by the peripheral end of the first opening Ma in a plan view and the oxide semiconductor layer 12c is exposed, and the fourth opening Md is formed in the second electrode 24 (functional layer removal step). Here, in the functional layer removal step, energy of the laser light L is converted to heat by irradiating the oxide semiconductor layer 12c with the laser light L, and at least the hole injection layer 1 of the lowest layer is sublimated and removed. With the sublimation of at least the hole injection layer 1 of the lowest layer, the upper layer thereof is detached from the oxide semiconductor layer 12c and removed. At least one layer of the hole transport layer 2, the electron transport layer 4, and the electron injection layer 5 above the hole injection layer 1 may also be sublimated and removed. Furthermore, the second electrode 24 is detached and removed with sublimation of the lower layer thereof.

As described above, the organic EL element 25 is formed to form the organic EL element layer 30.

Sealing Film Forming Step

First, on a surface of the substrate on which the organic EL element layer 30 formed in the organic EL element layer forming step described above is formed, the lower second inorganic insulating film 36 is formed using a mask by, for example, forming an inorganic insulating film such as a silicon nitride film, a silicon oxide film, or a silicon oxynitride film, by a plasma chemical vapor deposition (CVD) method. In this way, the lower second inorganic insulating film 36 can be formed in the non-display region N so as to cover the oxide semiconductor layer 12c exposed from the second opening Mb and the fourth opening Md.

Subsequently, on a surface of the substrate on which the lower second inorganic insulating film 36 is formed, an organic resin material such as an acrylic resin is film-formed by using, for example, an ink-jet method to form the organic insulating film 37.

Furthermore, an inorganic insulating film such as a silicon nitride film, a silicon oxide film, or a silicon oxynitride film is film-formed by a plasma CVD method on the substrate where the organic insulating film 37 is formed, by using a mask to form the upper second inorganic insulating film 38, thereby forming the sealing film 40.

Flexing Step

After a protective sheet (not illustrated) is bonded to a surface of the substrate on which the sealing film 40 is formed in the sealing film forming step, by irradiation with laser light from the glass substrate side of the resin substrate layer 10, the glass substrate is peeled off from a lower face of the resin substrate layer 10, and subsequently, a protective sheet (not illustrated) is bonded to the lower face of the resin substrate layer 10 from which the glass substrate has been peeled off.

Component Mounting Step

On the surface side of the resin substrate layer 10 from which the glass substrate has been peeled off in the flexing step, for example, the camera 45 is mounted in a housing accommodating the device main body in such a manner as to be disposed to face the oxide semiconductor layer.

The organic EL display device 50a of the present embodiment can be manufactured in this manner.

As described above, according to the organic EL display device 50a and the method for manufacturing the same of the present embodiment, the oxide semiconductor layer 12c is provided in an island shape in the non-display region N having an island shape disposed inside the display region D. Furthermore, the first opening Ma is provided in the gate insulating film 13, the first interlayer insulating film 15, and the second interlayer insulating film 17 of the TFT layer 20 in the non-display region N so as to expose the oxide semiconductor layer 12c. Accordingly, in the functional layer removal step of the organic EL element layer forming step, the oxide semiconductor layer 12c exposed from the gate insulating film 13, the first interlayer insulating film 15, and the second interlayer insulating film 17 is irradiated with the laser light L to convert the laser light L to heat, so that the hole injection layer 1, the hole transport layer 2, the electron transport layer 4, and the electron injection layer 5 as the common functional layer and the second electrode 24, which are formed in the non-display region N, can be removed. Here, the oxide semiconductor layer 12c is transparent and is less likely to lower performance of the camera 45. Thus, the oxide semiconductor layer 12c does not need to be removed by, for example, irradiation with laser light, after the hole injection layer 1, the hole transport layer 2, the electron transport layer 4, the electron injection layer 5, and the second electrode 24 are removed. As a result, the sealing structure by the sealing film 40 in the display region D is continuously provided in the non-display region N, so that sealing performance due to the sealing film 40 can be also ensured in the non-display region N. Accordingly, the hole injection layer 1, the hole transport layer 2, the electron transport layer 4, the electron injection layer 5, and the second electrode 24 in the non-display region N can be removed while ensuring sealing performance due to the sealing film 40.

In addition, according to the organic EL display device 50a and the method for manufacturing the same of the present embodiment, the lower second inorganic insulating film 36 and the oxide semiconductor layer 12c are in contact with each other via the second opening Mb formed in the hole injection layer 1, the hole transport layer 2, the electron transport layer 4, and the electron injection layer 5 and the fourth opening Md formed in the second electrode 24, and thus sealing performance due to the sealing film 40 can be reliably ensured.

Furthermore, according to the organic EL display device 50a and the method for manufacturing the same of the present embodiment, the sealing structure by the sealing film 40 in the display region D is continuously provided in the non-display region N. Thus, it is not necessary to provide a dam wall that holds back the organic insulating film 37 in the non-display region N, so that the display region D can be increased.

Moreover, according to the organic EL display device 50a and the method for manufacturing the same of the present embodiment, for example, the oxide semiconductor layer 12c having a lower light reflectance than that of the metal layer is irradiated with the laser light L. Thus, it is possible to suppress damage to the organic EL layer 23 due to stray light of reflected light of the laser light L and damage to the laser light irradiation device due to the reflected light of the laser light L.

Second Embodiment

Figure 11:
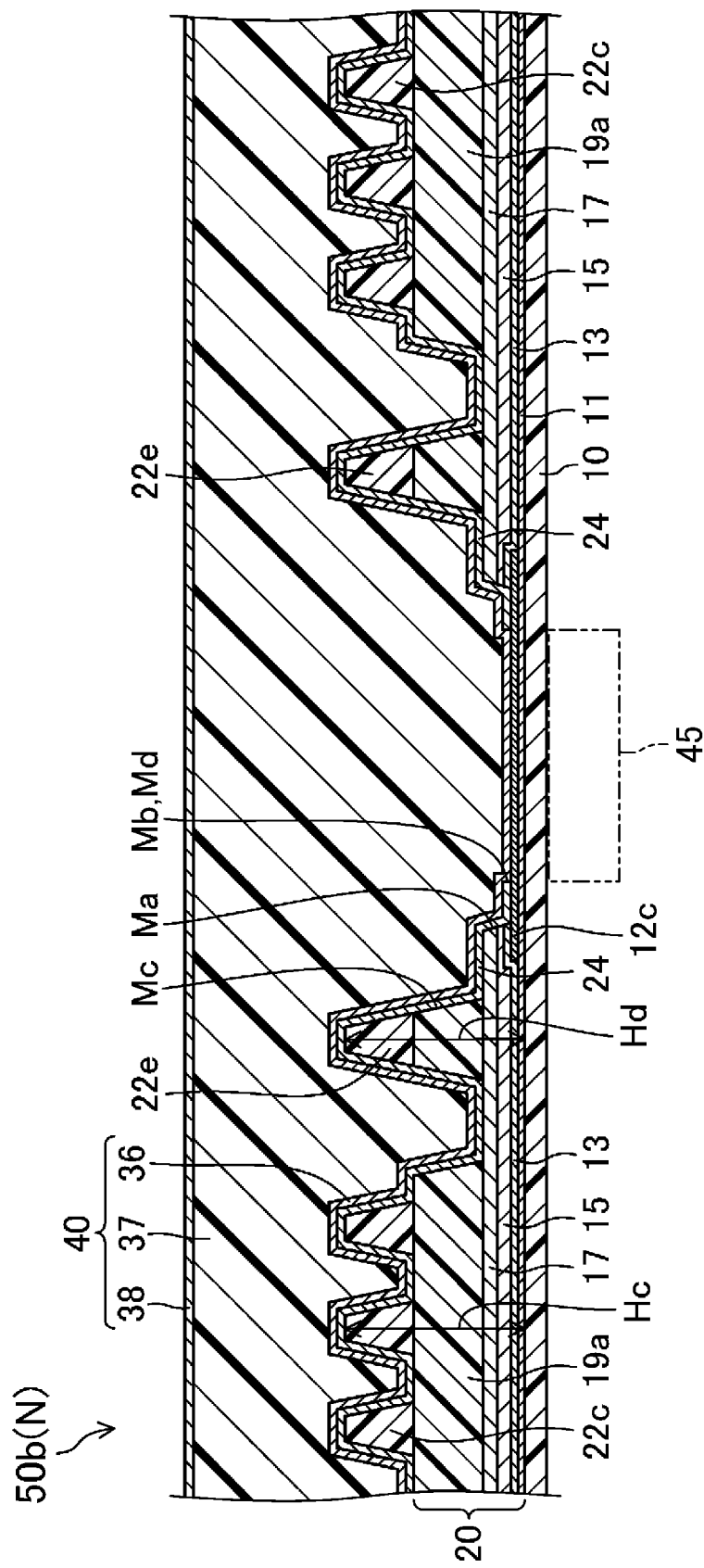
FIG. 11 is a cross-sectional view of a non-display region of an organic EL display device according to a second embodiment of the disclosure, and is a view corresponding to FIG. 9.

FIG. 11 illustrates a second embodiment of a display device and a method for manufacturing the same according to the disclosure. Here, FIG. 11 is a cross-sectional view of a non-display region N of an organic EL display device 50b according to the present embodiment, and is a view corresponding to FIG. 9. Note that, in the following embodiments, portions identical to those in FIGS. 1 to 10 are denoted by the same reference signs, and their detailed descriptions are omitted.

In the first embodiment described above, the organic EL display device 50a has been exemplified in which the plurality of non-display photospacers 22c are each provided in an island shape around the oxide semiconductor layer 12c, whereas in the present embodiment, the organic EL display device 50b will be exemplified in which a protrusion 22e is provided in a frame-like shape between the oxide semiconductor layer 12c and the plurality of non-display photospacers 22c.

As with the organic EL display device 50a of the first embodiment described above, the organic EL display device 50b includes a display region D provided in a rectangular shape in which an image is displayed and a frame region F provided in a frame-like shape in a periphery of the display region D.

As illustrated in FIG. 11, the organic EL display device 50b includes a resin substrate layer 10, a TFT layer 20 provided on a resin substrate layer 10, an organic EL element layer 30 provided on the TFT layer 20, and a sealing film 40 provided on the organic EL element layer 30.

As illustrated in FIG. 11, the organic EL display device 50b includes a plurality of non-display photospacers 22c each provided in an island shape as third photospacers in such a manner as to surround a third opening Mc and project upward in the drawing, on a flattening film 19a in the non-display region N.

As illustrated in FIG. 11, the organic EL display device 50b includes an oxide semiconductor layer 12c provided in a circular island shape in the non-display region N along the boundary with the display region D.

As illustrated in FIG. 11, the organic EL display device 50b includes the protrusion 22e provided in a frame-like shape on the flattening film 19a so as to surround the third opening Mc and project upward in the drawing in the non-display region N. Here, the protrusion 22e is formed of the same material as and in the same layer as those of an edge cover 22a, pixel photospacers 22s, frame photospacers 22b, and the non-display photospacers 22c, and is provided between the oxide semiconductor layer 12c and the plurality of non-display photospacers 22c in a plan view. Note that as illustrated in FIG. 9, a height Hd of the protrusion 22e from an upper face of the resin substrate layer 10 is the same as a height Ha of each of the pixel photospacers 22p (see FIG. 3), a height Hb of each of the frame photospacers 22b (see FIG. 6), and a height Hc of each of the non-display photospacers 22c, from the upper face of the resin substrate layer 10. Note that in the present embodiment, a configuration in which one protrusion 22e is provided in a frame-like shape to surround the oxide semiconductor layer 12c in a plan view has been exemplified, whereas a plurality of protrusions 22e may be provided in a frame-like shape to surround the oxide semiconductor layer 12c in a plan view.

As illustrated in FIG. 11, the organic EL display device 50b includes a camera 45 installed as an electronic component on a side opposite to the TFT layer 20 of the resin substrate layer 10 in the non-display region N in such a manner as to face the oxide semiconductor layer 12c.

The configuration of the display region D and the frame region F of the organic EL display device 50b is substantially the same as the configuration of the display region D and the frame region F of the organic EL display device 50a according to the first embodiment described above.

Similarly to the organic EL display device 50a of the first embodiment, the organic EL display device 50b described above is flexible and is configured to display an image by causing the light-emitting layer 3 of the organic EL layer 23 to emit light as required, via the first TFT 9a and the second TFT 9b in each of the subpixels P.

The organic EL display device 50b of the present embodiment can be manufactured by forming the protrusion 22e when the edge cover 22a is formed in the method for manufacturing the organic EL display device 50a of the first embodiment described above.

As described above, according to the organic EL display device 50b and the method for manufacturing the same of the present embodiment, in the non-display region N having an island shape disposed inside the display region D, the oxide semiconductor layer 12c is provided in an island shape, and a first opening Ma is provided in the gate insulating film 13, the first interlayer insulating film 15, and the second interlayer insulating film 17 of the TFT layer 20 so as to expose the oxide semiconductor layer 12c, in the non-display region N. Accordingly, similarly to the organic EL display device 50a of the first embodiment, it is possible to remove the hole injection layer 1, the hole transport layer 2, the electron transport layer 4, and the electron injection layer 5 as the common functional layer, and the second electrode 24 that are formed in the non-display region N while securing sealing performance due to the sealing film 40.

In addition, according to the organic EL display device 50b and the method for manufacturing the same of the present embodiment, similarly to the organic EL display device 50a of the first embodiment, the lower second inorganic insulating film 36 and the oxide semiconductor layer 12c are in contact with each other via the second opening Mb and the fourth opening Md. Thus, sealing performance due to the sealing film 40 can be reliably ensured.

Furthermore, according to the organic EL display device 50b and the method for manufacturing the same of the present embodiment, similarly to the organic EL display device 50a of the first embodiment, the sealing structure by the sealing film 40 in the display region D is continuously provided in the non-display region N. Thus, it is not necessary to provide a dam wall that holds back the organic insulating film 37 in the non-display region N, so that the display region D can be increased.

In addition, according to the organic EL display device 50b and the method for manufacturing the same of the present embodiment, similarly to the organic EL display device 50a of the first embodiment, the oxide semiconductor layer 12c having a lower light reflectance than that of a metal layer is irradiated with the laser light L. Thus, it is possible to suppress damage to the organic EL layer 23 due to stray light of reflected light of the laser light L and damage to the laser light irradiation device due to the reflected light of the laser light L.

In addition, according to the organic EL display device 50b and the method for manufacturing the same of the present embodiment, in the non-display region, the protrusion 22e is provided in a frame-like shape so as to surround the oxide semiconductor layer 12c, and thus, it is possible to prevent desorption components of the hole injection layer 1, the hole transport layer 2, the electron transport layer 4, the electron injection layer 5, and the second electrode 24 on the oxide semiconductor layer 12c from being scattered to the display region D.

Third Embodiment

Figure 12:
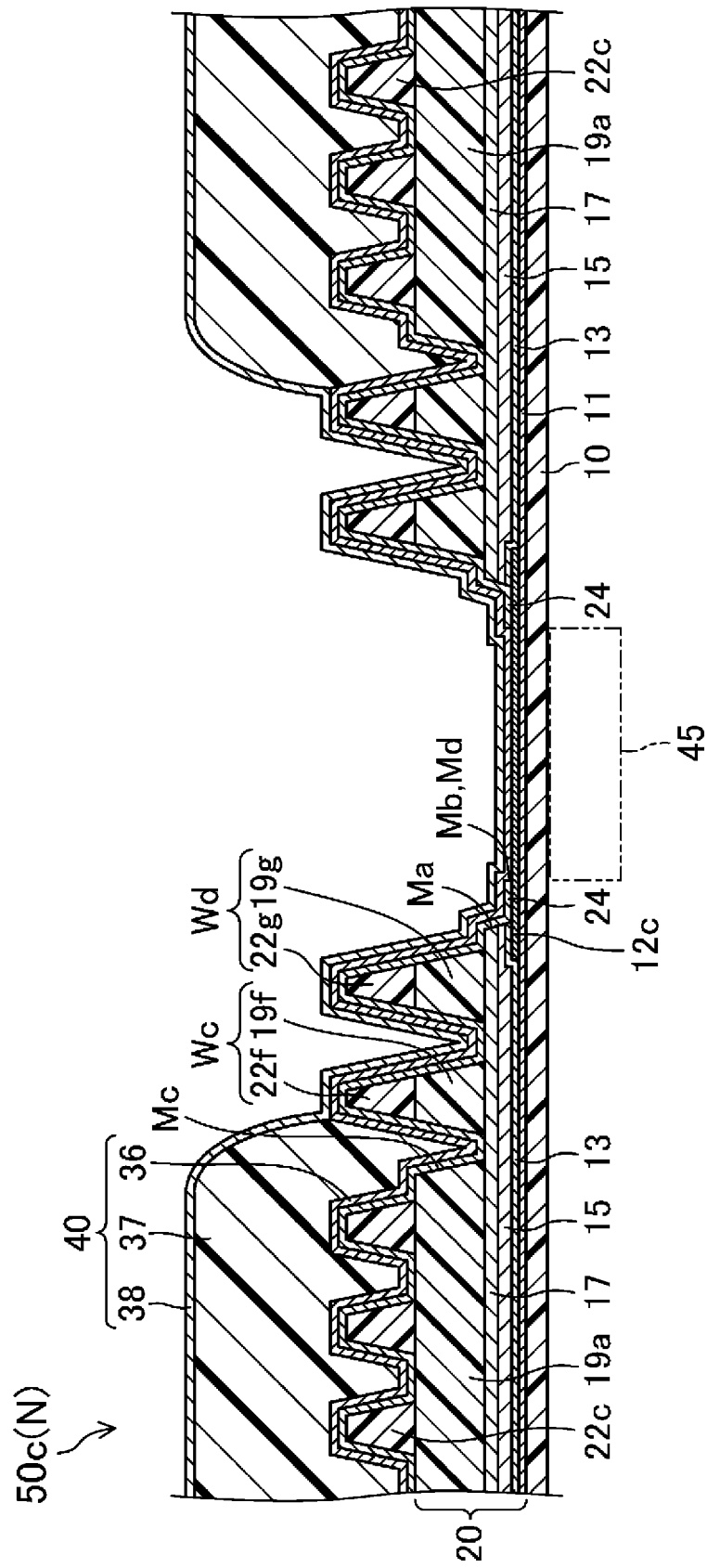
FIG. 12 is a cross-sectional view of a non-display region of an organic EL display device according to a third embodiment of the disclosure, and is a view corresponding to FIG. 9.

FIG. 12 illustrates a third embodiment of a display device and a method for manufacturing the same according to the disclosure. Here, FIG. 12 is a cross-sectional view of a non-display region N of an organic EL display device 50c according to the present embodiment, and is a view corresponding to FIG. 9.

In the first and second embodiments, the organic EL display devices 50a and 50b have been exemplified in which the organic insulating film 37 is provided so as to overlap with the first opening Ma, whereas in the present embodiment, the organic EL display device 50c will be exemplified in which the organic insulating film 37 is provided so as not to overlap with the first opening Ma.

Similarly to the organic EL display device 50a of the first embodiment described above, the organic EL display device 50c includes a display region D provided in a rectangular shape in which an image is displayed and a frame region F provided in a frame-like shape in a periphery of the display region D.

As illustrated in FIG. 12, the organic EL display device 50c includes a resin substrate layer 10, a TFT layer 20 provided on the resin substrate layer 10, an organic EL element layer 30 provided on the TFT layer 20, and a sealing film 40 provided on the organic EL element layer 30.

As illustrated in FIG. 12, the organic EL display device 50c includes a plurality of non-display photospacers 22c each provided in an island shape as third photospacers in such a manner as to surround a third opening Mc and project upward in the drawing, on a flattening film 19a in a non-display region N.

As illustrated in FIG. 12, the organic EL display device 50c includes an oxide semiconductor layer 12c provided in a circular island shape in the non-display region N along the boundary with the display region D.

As illustrated in FIG. 12, the organic EL display device 50c includes a first internal dam wall We and a second internal dam wall Wd each provided in a circular frame shape from the display region D side so as to surround the oxide semiconductor layer 12c in a plan view, between a first opening Ma and the third opening Mc in the non-display region N.

As illustrated in FIG. 12, the first internal dam wall We includes a first resin layer 19f formed of the same material as and in the same layer as those of the flattening film 19a, and a second resin layer 22f that is provided on the first resin layer 19f and is formed of the same material as and in the same layer as those of an edge cover 22a. Here, as illustrated in FIG. 12, the first internal dam wall We is provided on the display region D side of the non-display region N so as to overlap with an inner peripheral end portion of an organic insulating film 37 constituting the sealing film 40. Note that, as illustrated in FIG. 12, the organic insulating film 37 is provided so as not to overlap with the first opening Ma, a second opening Mb, and a fourth opening Md in a plan view.

As illustrated in FIG. 12, the second internal dam wall Wd includes a first resin layer 19g formed of the same material as and in the same layer as those of the flattening film 19a, and a second resin layer 22g that is provided on the first resin layer 19g and is formed of the same material as and in the same layer as those of the edge cover 22a.

As illustrated in FIG. 12, the organic EL display device 50c includes a camera 45 installed as an electronic component on a side opposite to the TFT layer 20 of the resin substrate layer 10 in the non-display region N in such a manner as to face the oxide semiconductor layer 12c.

The configuration of the display region D and the frame region F of the organic EL display device 50c is substantially the same as the configuration of the display region D and the frame region F of the organic EL display device 50a according to the first embodiment described above.

Similarly to the organic EL display device 50a of the first embodiment, the organic EL display device 50c described above is flexible and is configured to display an image by causing the light-emitting layer 3 of the organic EL layer 23 to emit light as required, via a first TFT 9a and a second TFT 9b in each of subpixels P.

The organic EL display device 50c of the present embodiment can be manufactured by forming the first resin layers 19f and 19g when the flattening film 19a is formed, and forming the second resin layers 22f and 22g when the edge cover 22a is formed in the method for manufacturing the organic EL display device 50a of the first embodiment.

As described above, according to the organic EL display device 50c and the method for manufacturing the same of the present embodiment, the oxide semiconductor layer 12c is provided in an island shape in the non-display region N having an island shape disposed inside the display region D, and the first opening Ma is provided in the gate insulating film 13, the first interlayer insulating film 15, and the second interlayer insulating film 17 of the TFT layer 20 so as to expose the oxide semiconductor layer 12c, in the non-display region N. Accordingly, similarly to the organic EL display device 50a of the first embodiment, it is possible to remove the hole injection layer 1, the hole transport layer 2, the electron transport layer 4, and the electron injection layer 5 as the common functional layer, and the second electrode 24 that are formed in the non-display region N while securing sealing performance due to the sealing film 40.

In addition, according to the organic EL display device 50c and the method for manufacturing the same of the present embodiment, similarly to the organic EL display device 50a of the first embodiment described above, the lower second inorganic insulating film 36 and the oxide semiconductor layer 12c are in contact with each other via the second opening Mb and the fourth opening Md. Thus, sealing performance due to the sealing film 40 can be reliably ensured.

In addition, according to the organic EL display device 50c and the method for manufacturing the same of the present embodiment, the organic insulating film 37 is provided so as not to overlap with the second opening Mb in a plan view. Thus, light absorption by the organic insulating film 37 is suppressed, so that a clearer image can be captured via the camera 45.

OTHER EMBODIMENTS

In each of the embodiments described above, the organic EL layer having a five-layered structure including the hole injection layer, the hole transport layer, the light-emitting layer, the electron transport layer, and the electron injection layer is exemplified, but the organic EL layer may have a three-layered structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In the above-described embodiments, the example of the organic EL display device in which the electrode of the TFT connected to the first electrode serves as the drain electrode is given. However, the disclosure is also applicable to an organic EL display device in which the electrode of the TFT connected to the first electrode is referred to as the source electrode.

Furthermore, in the embodiments described above, the organic EL display devices 50a to 50c each having the non-display region N formed in a circular shape in a plan view have been exemplified, but the non-display region N may have a polygonal shape such as a rectangular shape in a plan view, for example.

In the embodiments described above, the organic EL display devices 50a to 50c each including the sealing film 40 in which the organic insulating film 37 is provided between the lower second inorganic insulating film 36 and the upper second inorganic insulating film 38 have been exemplified, but the disclosure is also applicable to an organic EL display device obtained by forming an organic vapor deposition film between the lower second inorganic insulating film 36 and the upper second inorganic insulating film 38, and then ashing the organic vapor deposition film to cover foreign matters with the organic vapor deposition film. According to such a configuration of the sealing film, even if a foreign matter is present on the display region, the sealing performance can be ensured by the upper second inorganic insulating film, and the reliability can be improved.

In addition, in each of the embodiments described above, the organic EL display device is exemplified and described as the display device. The disclosure is, however, not limited to the organic EL display device and also applicable to any flexible display device. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:
1. A display device comprising:
a resin substrate;
a thin film transistor layer provided on the resin substrate and including a first inorganic insulating film;
a light-emitting element layer provided on the thin film transistor layer and including a plurality of light-emitting elements arranged corresponding to a plurality of subpixels constituting a display region; and
a sealing film provided on the light-emitting element layer to cover the light-emitting elements and including a second inorganic insulating film,
a frame region being provided around the display region,
a non-display region being provided in an island shape within the display region,
a first electrode, a functional layer, and a second electrode being sequentially layered in each of the light-emitting elements, and
the functional layer including a common functional layer provided in common to the plurality of subpixels,
wherein an oxide semiconductor layer is provided in an island shape in the non-display region,
a first opening is provided in the first inorganic insulating film to expose the oxide semiconductor layer in the non-display region,
the common functional layer is provided to extend from the display region to the non-display region, and
a second opening is provided to expose the oxide semiconductor layer in the common functional layer, a peripheral end of the second opening being surrounded by a peripheral end of the first opening in a plan view.
2. The display device according to claim 1,
wherein the oxide semiconductor layer and the second inorganic insulating film are in contact with each other in the second opening.

3. The display device according to claim 1,
wherein the oxide semiconductor layer is provided along a boundary between the display region and the non-display region.

4. The display device according to claim 1,
wherein the peripheral end of the first opening is surrounded by a peripheral end of the oxide semiconductor layer in a plan view.

5. The display device according to claim 1,
wherein the thin film transistor layer includes a flattening film provided on the first inorganic insulating film, and
a third opening is provided in the flattening film to expose the first inorganic insulating film, in the non-display region.

6. The display device according to claim 5,
wherein a peripheral end of the third opening surrounds the peripheral end of the first opening in a plan view.

7. The display device according to claim 6,
wherein a protrusion is provided in a frame-like shape to surround the third opening in a plan view and project upward, on the flattening film in the non-display region.

8. The display device according to claim 7,
wherein a plurality of first photospacers and a plurality of second photospacers are provided in an island shape in the display region and the frame region, respectively, and
the protrusion, the first photospacers, and the second photospacers are formed into an identical layer using an identical material.

9. The display device according to claim 8,
wherein a height of the protrusion from an upper face of the resin substrate is same as a height of each of the first photospacers and the second photospacers from the upper face of the resin substrate.

10. The display device according to claim 6,
wherein a plurality of third photospacers are provided in an island shape to surround the third opening in a plan view and project upward, on the flattening film in the non-display region.

11. The display device according to claim 1,
wherein the second inorganic insulating film includes a lower second inorganic insulating film provided on a side of the resin substrate, and an upper second inorganic insulating film provided on a side opposite to the resin substrate,
the sealing film includes an organic insulating film provided between the lower second inorganic insulating film and the upper second inorganic insulating film, and
a dam wall is provided in a frame-like shape in the frame region to surround the display region and overlap with a peripheral end portion of the organic insulating film.

12. The display device according to claim 1,
wherein a fourth opening is provided in the second electrode, a peripheral end of the fourth opening coinciding with a peripheral end of the second opening.

13. The display device according to claim 1,
wherein the thin film transistor layer includes a base coat film provided on a side of the resin substrate, and
the oxide semiconductor layer is provided on the base coat film.

14. The display device according to claim 1,
wherein the thin film transistor layer includes a plurality of thin film transistors provided corresponding to the plurality of subpixels, and
the oxide semiconductor layer and semiconductor layers constituting the thin film transistors are formed into an identical layer using an identical material.

15. The display device according to claim 1,
wherein the thin film transistor layer includes a gate insulating film provided as the first inorganic insulating film, and
a peripheral end portion of the oxide semiconductor layer is covered by the gate insulating film.

16. The display device according to claim 1,
wherein the sealing film is provided to overlap with the oxide semiconductor layer in the non-display region.

17. The display device according to claim 1,
wherein an electronic component is mounted on the resin substrate on a side opposite to the thin film transistor layer to face the oxide semiconductor layer.

18. A method for manufacturing a display device, the method comprising:
a thin film transistor layer forming step of forming a thin film transistor layer including a first inorganic insulating film on a resin substrate;
a light-emitting element layer forming step of forming a light-emitting element layer on the thin film transistor layer, the lig,ht-emitting, element layer including a plurality of light-emitting elements arranged corresponding to a plurality of subpixels constituting a display region; and
a sealing film forming step of forming a sealing film including a second inorganic insulating film on the light-emitting element layer to cover the light-emitting elements,
a frame region being provided around the display region,
a non-display region being provided in an island shape inside the display region,
a first electrode, a functional layer, and a second electrode being sequentially layered in the light-emitting elements, and
the functional layer including a common functional layer provided in common to the plurality of subpixels,
wherein the thin film transistor layer forming step includes
a semiconductor layer forming step of forming an oxide semiconductor layer in an island shape in the non-display region, and
a first opening forming step of forming a first opening to expose the oxide semiconductor layer to the first inorganic insulating film in the non-display region,
the light-emitting element layer forming step includes
a functional layer forming step of forming the common functional layer to cover the oxide semiconductor layer exposed from the first opening and extend from the display region to the non-display region, and
a functional layer removal step of removing the common functional layer of a portion covering the oxide semiconductor layer by irradiating the oxide semiconductor layer with laser light, and forming a second opening in the common functional layer to expose the oxide semiconductor layer, a peripheral end of the second opening being surrounded by a peripheral end of the first opening in a plan view, and
in the sealing film forming step, the second inorganic insulating film is formed to cover the oxide semiconductor layer exposed from the second opening.

19. The method for manufacturing a display device according to claim 18, the method further comprising
a component mounting step of mounting an electronic component on the resin substrate on a side opposite to the thin film transistor layer to face the oxide semiconductor layer after the sealing film forming step.

20. The method for manufacturing a display device according to claim 18,
wherein in the functional layer removal step, the oxide semiconductor layer is irradiated with laser light and an energy of the laser light is converted to heat to remove a part of the common functional layer.

* * * * *